US011430938B2

(12) United States Patent
Takahashi et al.

(10) Patent No.: US 11,430,938 B2
(45) Date of Patent: Aug. 30, 2022

(54) PIEZOELECTRIC DRIVING DEVICE HAVING A DETECTION ELEMENT AT THE CENTER OF A VIBRATING PORTION

(71) Applicant: Seiko Epson Corporation, Tokyo (JP)

(72) Inventors: Tomoaki Takahashi, Matsumoto (JP); Akio Konishi, Matsumoto (JP)

(73) Assignee: Seiko Epson Corporation

( * ) Notice: Subject to any disclaimer, the term of this patent is extended or adjusted under 35 U.S.C. 154(b) by 792 days.

(21) Appl. No.: 16/298,066

(22) Filed: Mar. 11, 2019

(65) Prior Publication Data

US 2019/0280185 A1  Sep. 12, 2019

(30) Foreign Application Priority Data

Mar. 12, 2018  (JP) .............................. JP2018-044543

(51) Int. Cl.
*H01L 41/09* (2006.01)
*H01L 41/047* (2006.01)
*B41J 2/14* (2006.01)
*H02N 2/00* (2006.01)
*H02N 2/10* (2006.01)

(52) U.S. Cl.
CPC ...... *H01L 41/0913* (2013.01); *B41J 2/14201* (2013.01); *H01L 41/0475* (2013.01); *H02N 2/004* (2013.01); *H02N 2/0055* (2013.01); *H02N 2/103* (2013.01)

(58) Field of Classification Search
CPC . H01L 41/0913; H01L 41/0475; H02N 2/004; H02N 2/0055; H02N 2/103; H02N 2/0015; B25J 9/12; B41J 2/14201; B65H 2403/921
See application file for complete search history.

(56) References Cited

U.S. PATENT DOCUMENTS

| 7,514,843 | B2* | 4/2009 | Nagahama ............... G04C 3/12 310/317 |
| 2004/0080243 | A1* | 4/2004 | Miyazawa ............ H02N 2/004 310/328 |
| 2007/0188048 | A1 | 8/2007 | Nagahama et al. |
| 2017/0199375 | A1 | 7/2017 | Naono |
| 2017/0279033 | A1* | 9/2017 | Kajino .................. F04B 43/082 |
| 2017/0279378 | A1* | 9/2017 | Kajino .................... B25J 9/123 |

FOREIGN PATENT DOCUMENTS

| JP | 2007-166816 A | 6/2007 |
| JP | 2009-027775 A | 2/2009 |
| WO | 2006-004108 A1 | 1/2006 |
| WO | 2016-052547 A1 | 4/2016 |

\* cited by examiner

*Primary Examiner* — Emily P Pham
(74) *Attorney, Agent, or Firm* — Harness, Dickey & Pierce, P.L.C.

(57) ABSTRACT

A piezoelectric driving device includes a vibrating portion including a piezoelectric element for driving and a piezoelectric element for detection and vibrating by driving of the piezoelectric element for driving, a drive circuit that generates a drive signal for driving the piezoelectric element for driving, and a detection circuit that detects vibration of the vibrating portion based on a detection signal output from the piezoelectric element for detection with the vibration of the vibrating portion, wherein the piezoelectric element for detection is placed in an area containing a center of the vibrating portion.

6 Claims, 14 Drawing Sheets

PIEZOELECTRIC DRIVING DEVICE HAVING A DETECTION ELEMENT AT THE CENTER OF A VIBRATING PORTION

BACKGROUND

1. Technical Field

The present invention relates to a piezoelectric driving device, a robot, an electronic component conveyance apparatus, a printer, and a projector.

2. Related Art

Piezoelectric driving devices using piezoelectric actuators having piezoelectric elements are known. For example, the piezoelectric actuator disclosed in Patent Document 1 (JP-A-2007-166816) includes a vibrator having piezoelectric elements in nearly rectangular shapes provided on both front and back surfaces of a reinforcing plate. Here, on the piezoelectric element, a first drive electrode provided along the longitudinal direction of the piezoelectric element and a pair of second drive electrodes respectively placed in separate positions in the longitudinal direction of the piezoelectric element on both sides in the width direction of the piezoelectric element are provided, and a detection electrode for detecting vibration of the vibrator is provided in another area than the areas provided with the first drive electrode and the second drive electrodes. Further, an arm part projecting toward both sides in the width direction are integrally formed nearly at the center of the reinforcing plate in the longitudinal direction.

In the piezoelectric actuator disclosed in Patent Document 1, the detection electrode is in the position apart from the center of the vibrator. Accordingly, when sufficient areas of the first drive electrode and the second drive electrodes are desired, if a wire is routed from the detection electrode to the arm part of the reinforcing plate, the wire must be placed in an area close to the first drive electrode or second drive electrodes and noise is mixed from the first drive electrode or second drive electrodes into the wire due to electromagnetic interferences of the drive signal. Thus, it is hard to detect the vibration of the vibrator with high accuracy.

SUMMARY

A piezoelectric driving device according to an application example of the invention includes a vibrating portion including a piezoelectric element for driving and a piezoelectric element for detection and vibrating by driving of the piezoelectric element for driving, a drive circuit that generates a drive signal for driving the piezoelectric element for driving, and a detection circuit that detects vibration of the vibrating portion based on a detection signal output from the piezoelectric element for detection with the vibration of the vibrating portion, wherein the piezoelectric element for detection is placed in an area containing a center of the vibrating portion.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, a piezoelectric driving device, a robot, an electronic component conveyance apparatus, a printer, and a projector according to the invention will be explained in detail based on preferred embodiments shown in the accompanying drawings.

1. Piezoelectric Driving Device

First Embodiment

Figure 1:
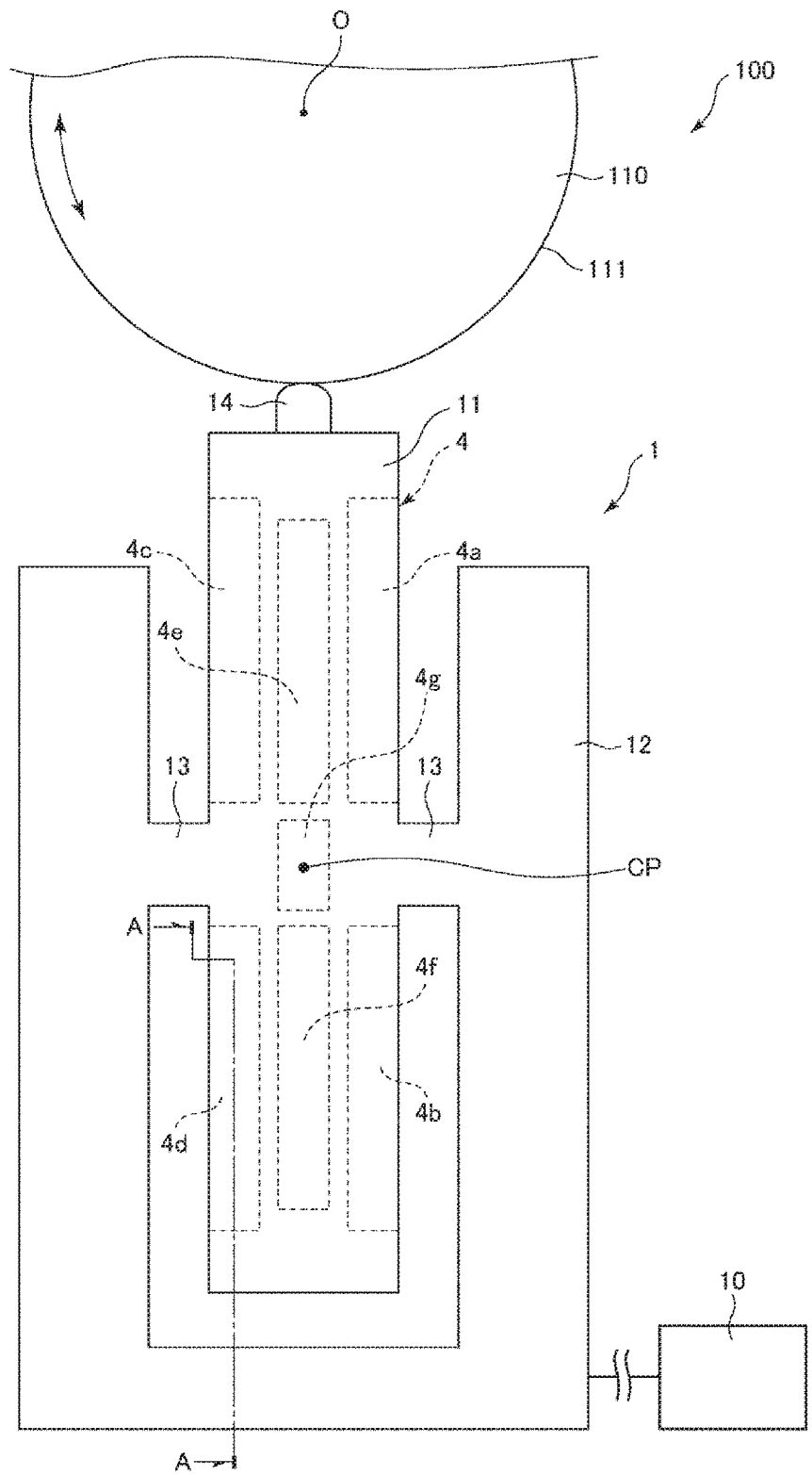
FIG. 1 is a plan view showing an overall configuration of a piezoelectric driving device (piezoelectric motor) according to a first embodiment of the invention.
Figure 2:
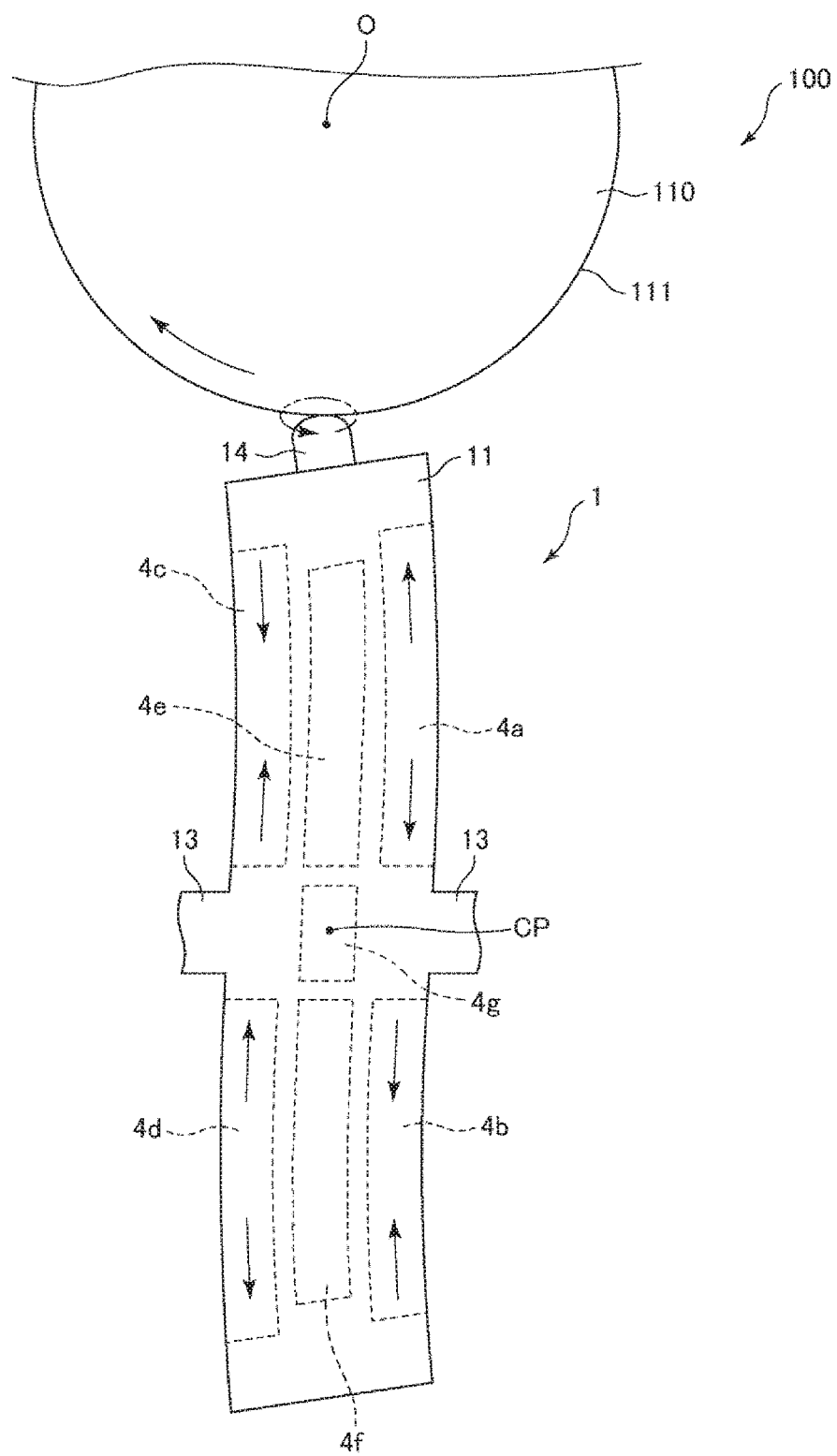
FIG. 2 is a diagram for explanation of an action of the piezoelectric driving device shown in FIG. 1.
Figure 3:
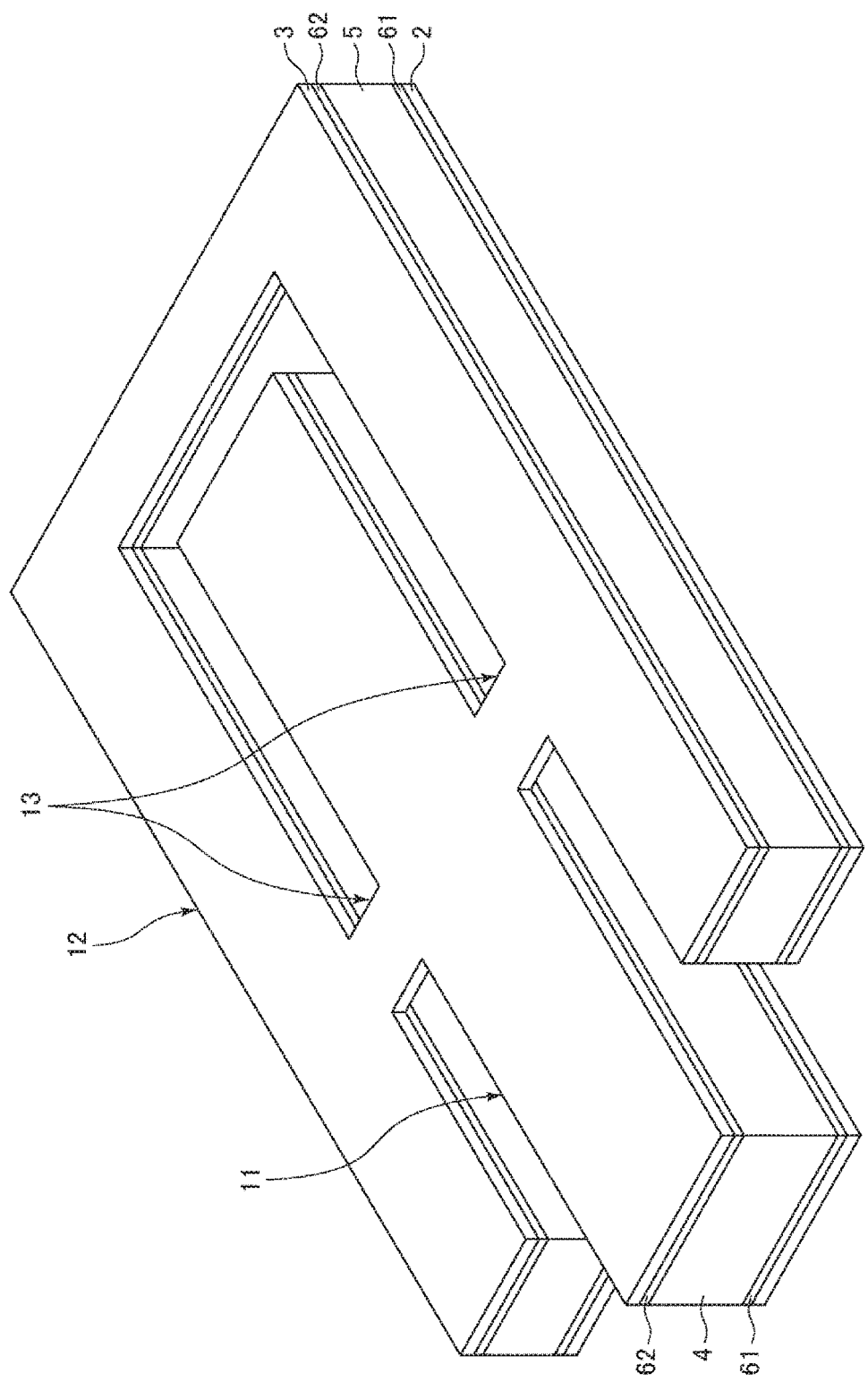
FIG. 3 is a perspective view of a vibrating portion, a supporting portion, and connecting portions of a piezoelectric actuator shown in FIG. 1.
Figure 4:
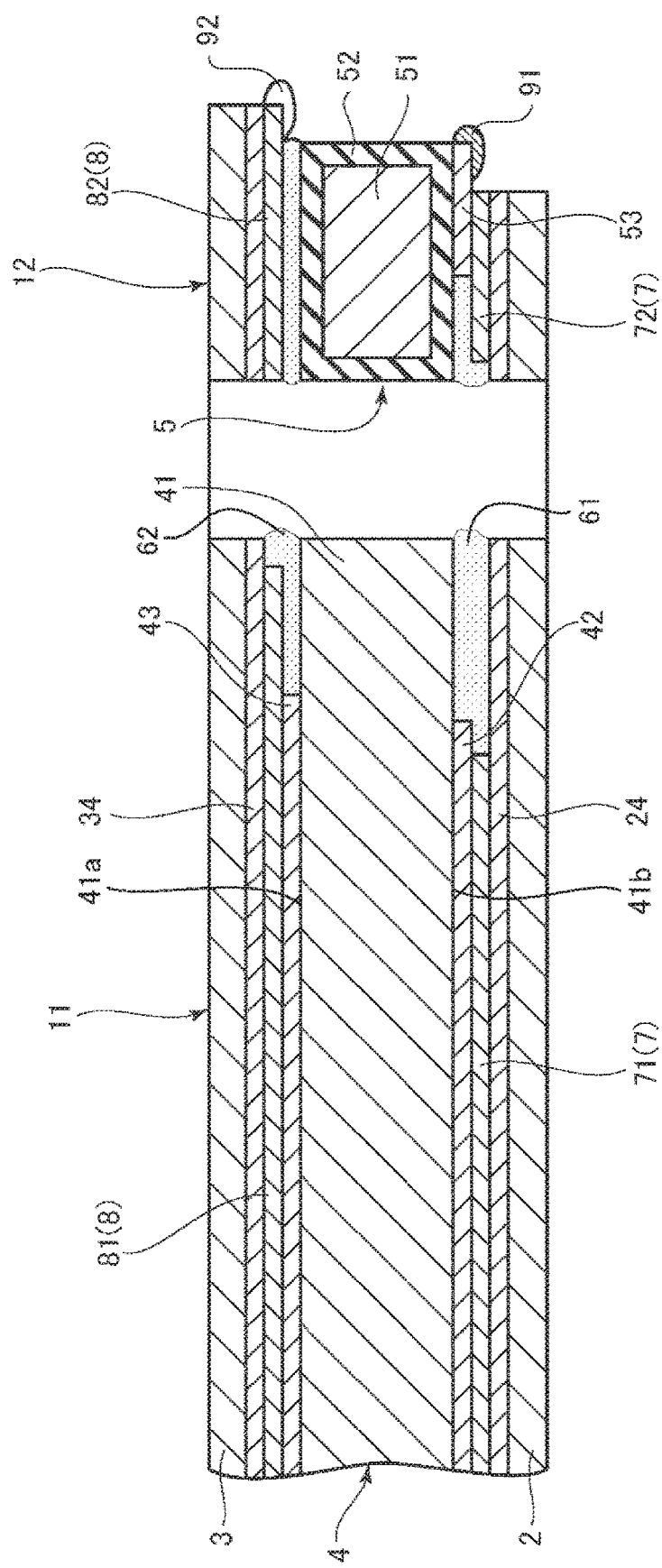
FIG. 4 is a sectional view along line A-A in FIG. 1.
Figure 5:
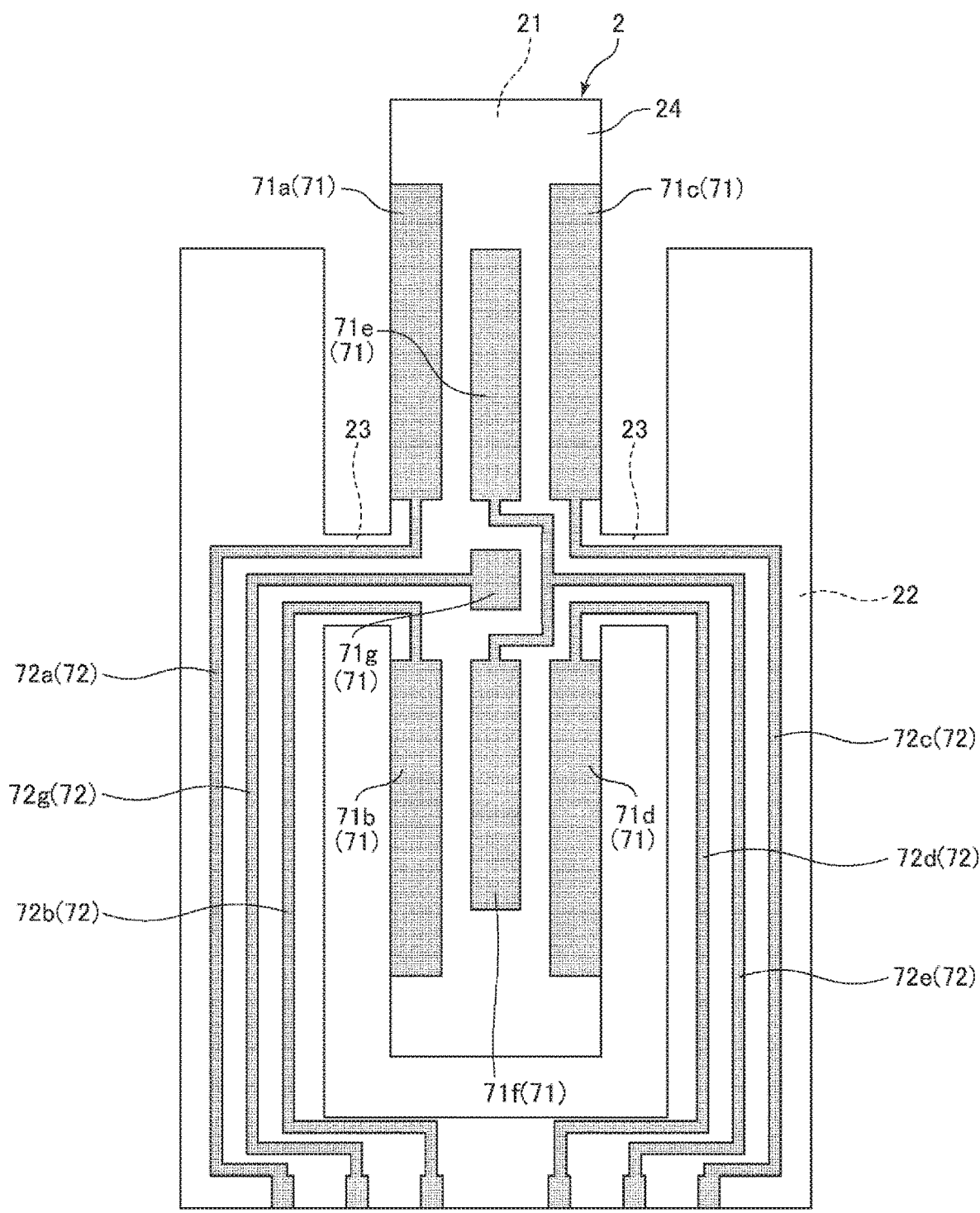
FIG. 5 is a plan view of a first vibrating plate of the piezoelectric actuator shown in FIG. 1.
Figure 6:
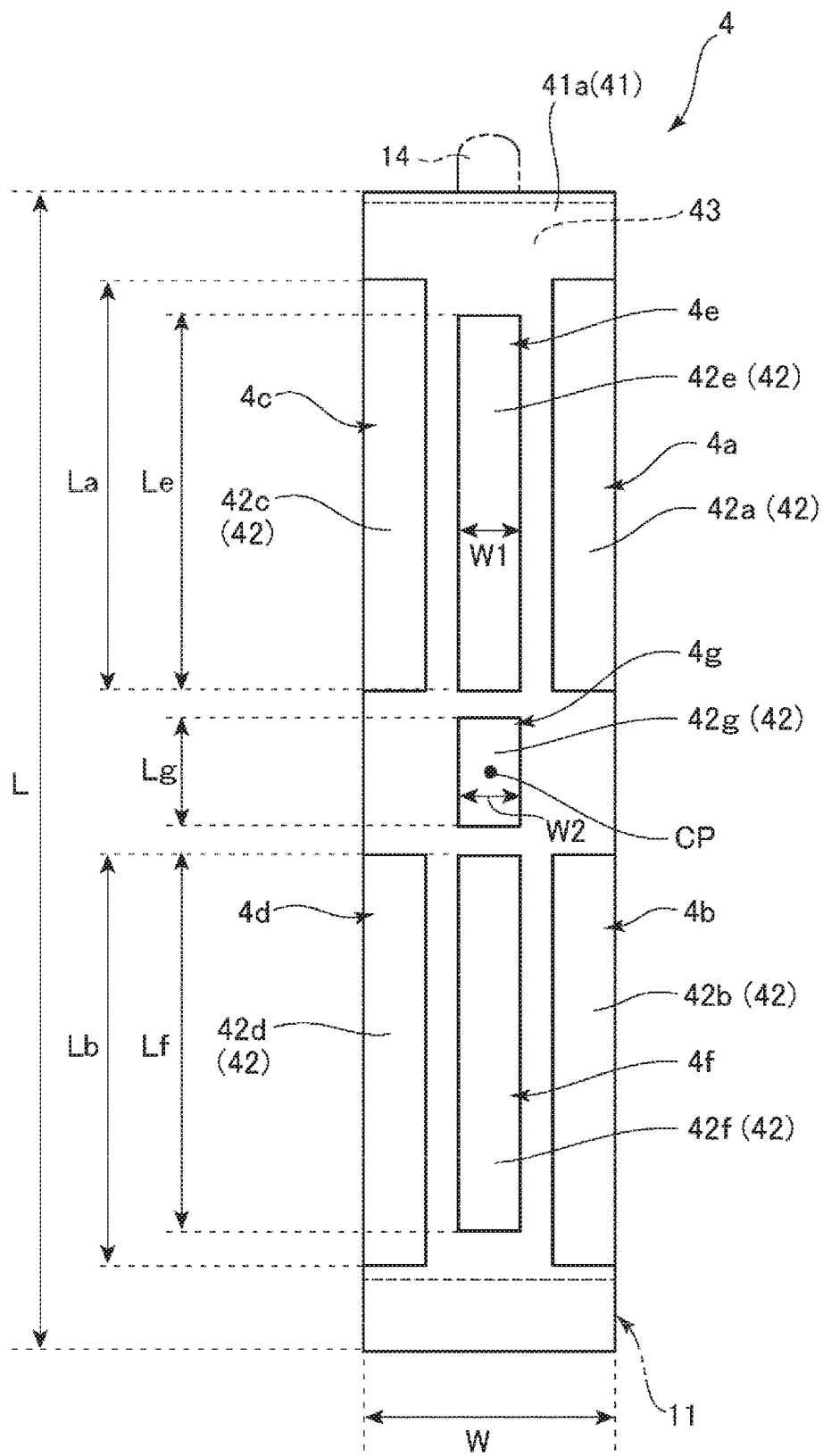
FIG. 6 is a plan view of piezoelectric elements of the piezoelectric actuator shown in FIG. 1 as seen from the first vibrating plate side.
Figure 7:
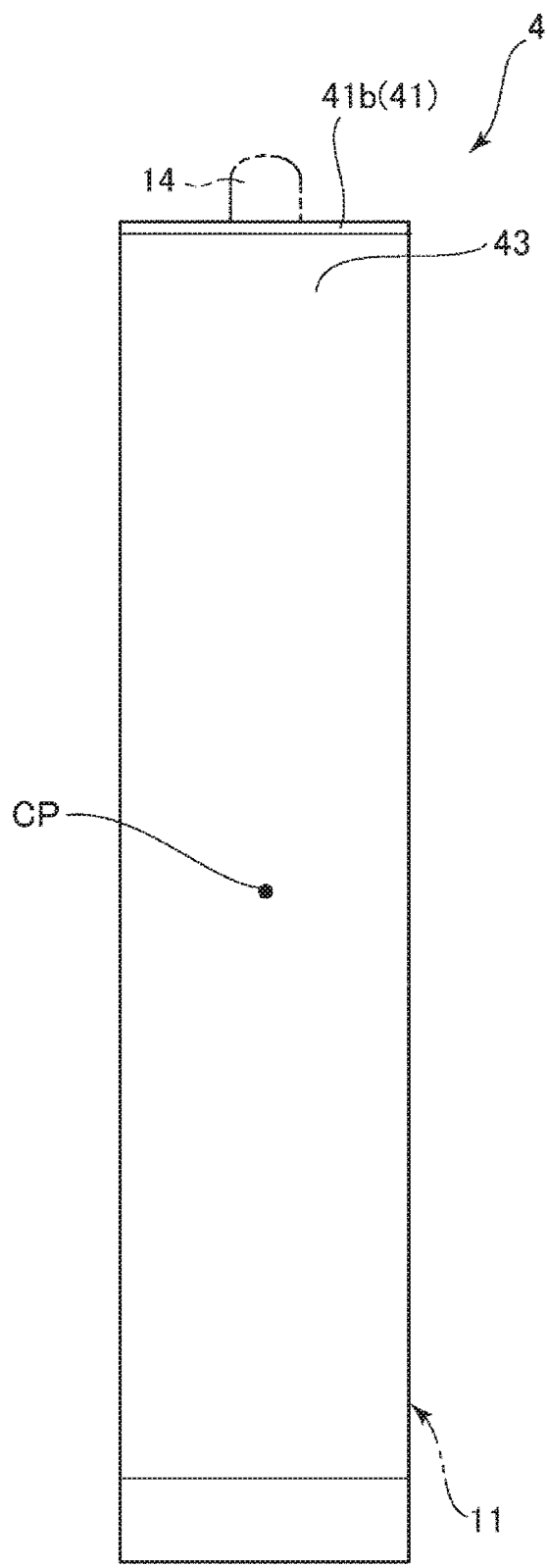
FIG. 7 is a plan view of the piezoelectric elements of the piezoelectric actuator shown in FIG. 1 as seen from a second vibrating plate side.
Figure 8:
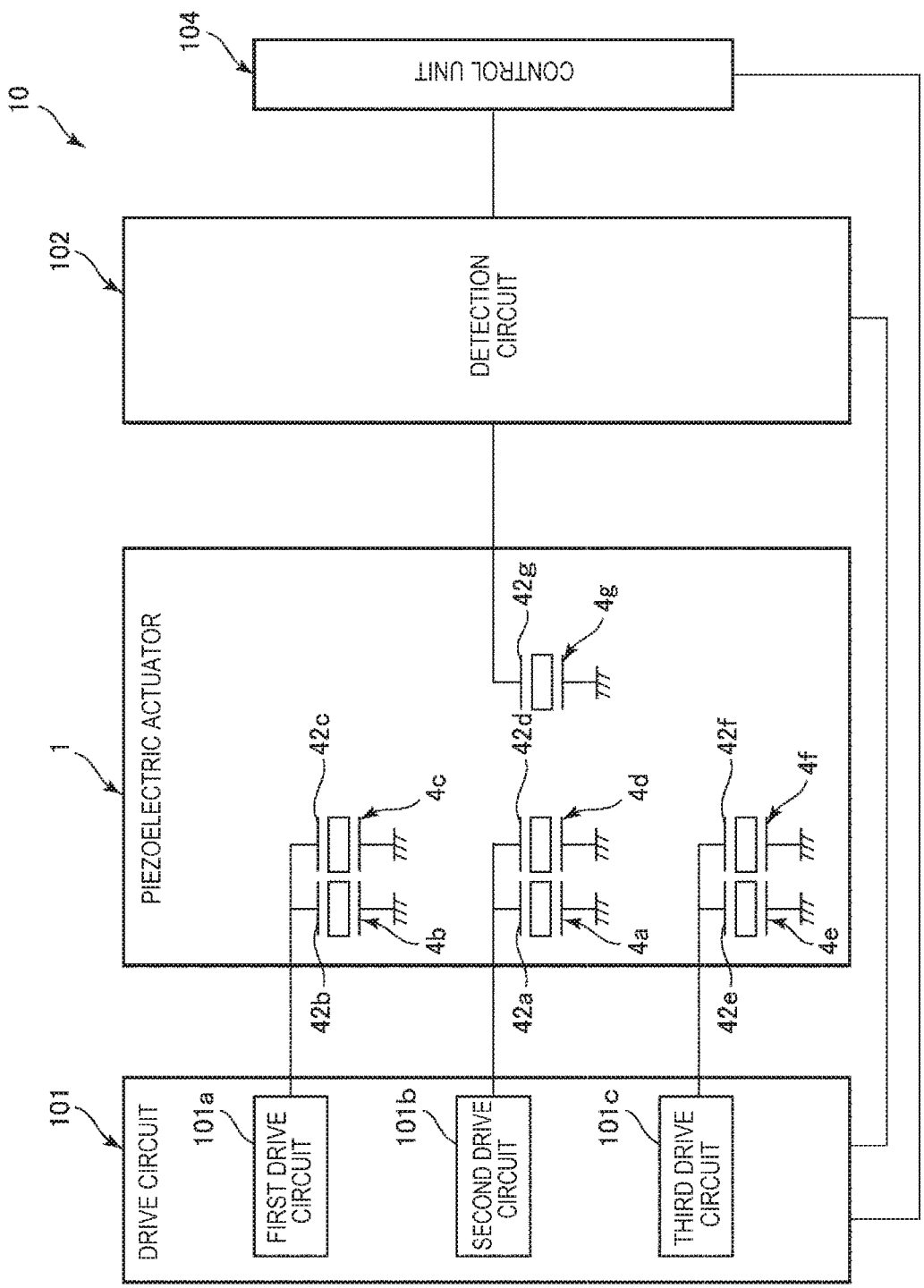
FIG. 8 is a block diagram showing a configuration of a controller of the piezoelectric driving device shown in FIG. 1.

FIG. 1 is a plan view showing an overall configuration of a piezoelectric driving device (piezoelectric motor) according to the first embodiment of the invention. FIG. 2 is a diagram for explanation of an action of the piezoelectric driving device shown in FIG. 1. FIG. 3 is a perspective view of a vibrating portion, a supporting portion, and connecting portions of a piezoelectric actuator shown in FIG. 1. FIG. 4 is a sectional view along line A-A in FIG. 1. FIG. 5 is a plan view of a first vibrating plate of the piezoelectric actuator shown in FIG. 1. FIG. 6 is a plan view of piezoelectric elements of the piezoelectric actuator shown in FIG. 1 as seen from the first vibrating plate side. FIG. 7 is a plan view of the piezoelectric elements of the piezoelectric actuator shown in FIG. 1 as seen from a second vibrating plate side. FIG. 8 is a block diagram showing a configuration of a controller of the piezoelectric driving device shown in FIG. 1.

A piezoelectric driving device 100 shown in FIG. 1 is a piezoelectric motor that outputs a rotational force using an inverse piezoelectric effect. The piezoelectric driving device 100 has a rotor 110 as a driven member (following part) rotatable about a rotation axis O, a piezoelectric actuator 1 in contact with an outer circumferential surface 111 of the rotor 110, and a controller 10 that controls driving of the piezoelectric actuator 1. In the piezoelectric driving device 100, the piezoelectric actuator 1 transmits the drive power thereof to the rotor 110, and thereby, the rotor 110 rotates (revolves) about the rotation axis O.

Note that the placement of the piezoelectric actuator 1 is not limited to the illustrated position as long as desired drive power may be transmitted from the piezoelectric actuator 1 to the driven member, but the piezoelectric actuator 1 may be in contact with the plate surface (bottom surface) of the rotor 110. Or, the piezoelectric driving device 100 may have a configuration in which a plurality of piezoelectric actuators 1 are in contact with a single driven member. Or, a plurality of piezoelectric actuators 1 may be staked for use. Or, the configuration of the piezoelectric driving device 100 is not limited to the illustrated configuration in which the driven member is rotationally moved, but may be e.g. a configuration in which the driven member is linearly moved.

Piezoelectric Actuator

As shown in FIG. 1, the piezoelectric actuator 1 has a vibrating portion 11 having a longitudinal shape extending in the upward and downward directions in FIG. 1, a supporting portion 12, a pair of connecting portions 13 connecting these portions, and a transmitting portion 14 (convex portion) projecting from one end part (distal end part) of the vibrating portion 11 in the longitudinal direction. Here, the vibrating portion 11 has a piezoelectric element 4. Further, the supporting portion 12 has an intermediate member 5 to make the thickness equal to that of the vibrating portion 11. The vibrating portion 11 is supported in both ends with respect to the supporting portion 12 by the pair of left and right connecting portions in the center part in the longitudinal direction. Further, a center CP of the vibrating portion 11 is located between the connecting portions 13 in the plan view in FIG. 1.

The piezoelectric element 4 has piezoelectric elements 4a, 4b, 4c, 4d, 4e, 4f for driving and a piezoelectric element 4g for detection. The piezoelectric elements 4a, 4b, 4c, 4d, 4e, 4f for driving expand and contract by the inverse piezoelectric effect so that the distal end of the transmitting portion 14 may make an elliptic motion as shown in FIG. 2 when the drive signals are input thereto. Thereby, the transmitting portion 14 provides drive power to the outer circumferential surface 111 in one direction in the circumferential directions thereof and rotates the rotor 110 about the rotation axis O. Here, the vibration of the vibrating portion 11 is vibration combining S-shaped (or inversed S-shaped) flexural vibration (lateral vibration) by the expansion and contraction of the piezoelectric elements 4a, 4b, 4c, 4d and longitudinal vibration by the expansion and contraction of the piezoelectric elements 4e, 4f. The piezoelectric element 4g for detection outputs electric charge according to the drive state (vibration state) of the vibrating portion 11 as a detection signal by the piezoelectric effect with the vibration of the vibrating portion 11. The controller 10 controls driving of the piezoelectric actuator 1 based on the detection signal.

The transmitting portion 14 is formed using e.g. a material such as ceramics having higher resistance to wear and joined to the vibrating portion 11 using an adhesive or the like. Note that the shape of the transmitting portion 14 is not limited to the illustrated shape as long as the portion can transmit the drive power of the piezoelectric actuator 1 to the rotor 110 (driven member).

The piezoelectric actuator 1 is formed to have a stacking structure as shown in FIG. 3. That is, as shown in FIG. 3, the vibrating portion 11, the supporting portion 12, and the connecting portions 13 have a first vibrating plate 2, a second vibrating plate 3, and the piezoelectric element 4 and the intermediate member 5 placed between the plates. The first vibrating plate 2 is joined to the piezoelectric element 4 and the intermediate member 5 via an adhesive 61. Similarly, the second vibrating plate 3 is joined to the piezoelectric element 4 and the intermediate member 5 via an adhesive 62. As below, the respective parts of the piezoelectric actuator 1 will be sequentially explained.

The first vibrating plate 2 and the second vibrating plate 3 respectively have plan view shapes corresponding to the above described vibrating portion 11, supporting portion 12, and connecting portions 13. The first vibrating plate 2 and the second vibrating plate 3 have portions (vibrating portions) sandwiching the piezoelectric element 4, and the stacking structure including the portions and the piezoelectric element 4 forms the vibrating portion 11. Further, the first vibrating plate 2 and the second vibrating plate 3 have portions sandwiching the intermediate member 5, and the stacking structure including the portions and the intermediate member 5 forms the supporting portion 12. Note that none of the piezoelectric element 4 and the intermediate member 5 is placed in the connecting portions 13, and gaps corresponding to the thickness of the piezoelectric element 4 or the intermediate member 5 are formed between the first vibrating plate 2 and the second vibrating plate 3. In FIG. 5, regarding the first vibrating plate 2, a vibrating portion 21, a supporting portion 22, and connecting portions 23 are respectively shown as portions corresponding to the above described vibrating portion 11, supporting portion 12, and connecting portions 13.

The first vibrating plate 2 and the second vibrating plate 3 are respectively not particularly limited, but semiconductor substrates e.g. silicon substrates, silicon carbide substrates, or the like may be used. A semiconductor substrate (particularly, silicon substrate) is used as the first vibrating plate 2 or the second vibrating plate 3, and thereby, the first vibrating plate 2 or the second vibrating plate 3 may be manufactured with higher productivity and higher accuracy by the silicon wafer process (MEMS process).

An insulating layer 24 is provided on the piezoelectric element 4 side (upside in FIG. 4) of the first vibrating plate 2. Thereby, short circuit of a wiring layer 7 via the first vibrating plate 2 may be reduced. Similarly, an insulating layer 34 is provided on the piezoelectric element 4 side (downside in FIG. 4) of the second vibrating plate 3. Thereby, short circuit of a wiring layer 8 via the second vibrating plate 3 may be reduced. For example, when silicon substrates are respectively used for the first vibrating plate 2 and the second vibrating plate 3, the insulating layers 24, 34 are silicon oxide films formed by thermal oxidation of the surfaces of the silicon substrates. Note that the insulating layers 24, 34 are not limited to the silicon oxide films formed by thermal oxidation, but may be e.g. silicon oxide films formed by CVD using TEOS (tetraethoxysilane) or the like. Or, the insulating layers 24, 34 are respectively not limited to silicon oxide films as long as the layers have insulation properties, but may be e.g. inorganic films such as silicon nitride films or organic films formed using various resin materials such as epoxy resin, urethane resin, urea resin, melamine resin, phenol resin, ester resin, or acrylic resin. Or, each of the insulating layers 24, 34 may be a laminated film of a plurality of layers formed using different materials.

The wiring layer 7 is placed on the insulating layer 24 of the first vibrating plate 2. The wiring layer 7 has first electrodes 71 (wiring electrodes) placed on the vibrating portion 11 and first wires 72 placed from the first electrodes 71 via the connecting portions 13 to the supporting portion 12 (see FIG. 4). For example, these are formed collectively in a known deposition process.

As shown in FIG. 5, the first electrodes 71 have a plurality of first electrodes 71a, 71b, 71c, 71d, 71e, 71f, 71g provided to correspond to the piezoelectric elements 4a, 4b, 4c, 4d, 4e, 4f, 4g and these are electrically connected to the corresponding piezoelectric elements 4a, 4b, 4c, 4d, 4e, 4f, 4g (more specifically, first electrodes 42a, 42b, 42c, 42d, 42e, 42f, 42g, which will be described later), respectively. The first wires 72 have a plurality of first electrodes 72a, 72b, 72c, 72d, 72e, 72f, 72g provided to correspond to the plurality of first electrodes 71, and these are respectively routed from the corresponding first electrodes 71 to the end part of the supporting portion 12. Further, terminals 91 electrically connected to substrates (not shown) are connected to the end parts of the respective first wires 72 via wires 53 on the intermediate member 5 (see FIG. 4). Note that the terminals 91 may be provided directly on the end parts of the respective first wires 72.

On the other hand, the wiring layer 8 is placed on the insulating layer 34 of the second vibrating plate 3. As shown in FIG. 4, the wiring layer 8 has second electrodes 81 placed on the vibrating portion 11 and second wires 82 placed from the second electrodes 81 via the connecting portions 13 to the supporting portion 12. For example, these are formed collectively in a known deposition process.

The second electrodes 81 are electrically connected to the above described piezoelectric element 4 (more specifically, a second electrode 43, which will be described later). The second wires 82 are routed to the end part of the supporting portion 12. Further, terminals electrically connected to substrates (not shown) are provided in the end parts of the second wires 82 (see FIG. 4).

The constituent materials of the wires 53, the wiring layers 7, 8, and the terminals 92, 91 are respectively not particularly limited, but include metal materials e.g. aluminum (Al), nickel (Ni), gold (Au), platinum (Pt), copper (Cu), titanium (Ti), and tungsten (W). Further, the terminals 92 may be formed using a known deposition method.

The above described first vibrating plate 2 and second vibrating plate 3 are joined to the piezoelectric element 4 and the intermediate member 5 by the adhesives 61, 62. Here, the adhesive 61 joins the first vibrating plate 2 and the piezoelectric element 4 to permit the electrical connection between the wiring layer 7 and the piezoelectric element 4. Further, the adhesive 62 joins the second vibrating plate 3 and the piezoelectric element 4 to permit the electrical connection between the wiring layer 8 and the piezoelectric element 4. The adhesives 61, 62 are respectively not particularly limited, but e.g. various adhesives such as epoxy, acrylic, silicon adhesives, anisotropic adhesives, or the like may be used.

As shown in FIG. 6, the piezoelectric element 4 has a plate-like piezoelectric material 41, a first electrode 42 placed on a first surface 41a as one surface (on the first vibrating plate 2 side) of the piezoelectric material 41, and a second electrode 43 placed on a second surface 41b as the other surface (on the second vibrating plate 3 side) of the piezoelectric material 41.

The piezoelectric material 41 has a rectangular shape in the plan view. The constituent material of the piezoelectric material 41 includes e.g. piezoelectric ceramics such as lead titanate zirconate (PZT), barium titanate, lead titanate, potassium niobate, lithium niobate, lithium tantalate, sodium tungstate, zin oxide, barium strontium titanate (BST), strontium bismuth tantalate (SBT), lead metaniobate, and lead scandium niobate. Note that, as the constituent material of the piezoelectric material 41, not only the above described piezoelectric ceramics but also polyvinylidene fluoride, quartz crystal, or the like may be used.

The piezoelectric material 41 may be formed from a bulk material or formed using the so-gel method or sputtering method, and may be preferably formed from the bulk material. Thereby, the thickness of the piezoelectric material 41 may be made larger and the electrical capacitance of the piezoelectric element 4 may be made smaller. Accordingly, the current efficiency of the piezoelectric actuator 1 may be further improved.

The first electrode 42 includes a plurality of (seven) first electrodes 42a, 42b, 42c, 42d, 42e, 42f, 42g as individual electrodes individually provided with respect to each of the piezoelectric elements 4a, 4b, 4c, 4d, 4e, 4f, 4g. Of the electrodes, the first electrodes 42a, 42b, 42c, 42d, 42e, 42f are respectively signal electrodes for driving to which drive signals (drive voltages) are input. Further, the first electrode 42g is a signal electrode for detection that outputs a detection signal according to the vibration state of the vibrating portion 11. On the other hand, the second electrode 43 is a ground electrode serving as both a ground electrode for driving and a ground electrode for detection electrically connected to a fixed potential (e.g. ground potential) as a common electrode commonly provided to the piezoelectric elements 4a, 4b, 4c, 4d, 4e, 4f, 4g (see FIG. 7).

That is, the piezoelectric element 4a includes the piezoelectric material 41, the first electrode 42a, and the second electrode 43. Similarly, the piezoelectric elements 4b, 4c, 4d, 4e, 4f, 4g include the piezoelectric material 41, the first electrodes 42b, 42c, 42d, 42e, 42f, 42g and the second electrode 43. As described above, the piezoelectric element 4 has the seven piezoelectric elements 4a, 4b, 4c, 4d, 4e, 4f, 4g.

Here, of the first electrodes 42a, 42b, 42c, 42d, 42e, 42f as the signal electrodes for driving, the first electrodes 42a, 42b, 42c, 42d are electrodes for flexion that generate electric fields for flexural vibration (the above described lateral vibration) of the vibrating portion 11 between the second electrode 43 and themselves when the drive signals are input. On the other hand, the first electrodes 42e, 42f are electrodes for longitudinal vibration that generate electric fields for stretching vibration (the above described longitudinal vibration) of the vibrating portion 11 between the second electrode 43 and themselves without flexion when the drive signals are input.

In the embodiment, the first electrode 42g is placed in the center part of the piezoelectric material 41 in the width direction and the longitudinal direction. Therefore, the piezoelectric element 4g as the piezoelectric element for detection is placed in an area containing the center CP of the vibrating portion 11. Thereby, as shown in FIG. 5, it is not necessary to route the above described first wire 72g along the longitudinal direction of the first electrodes 42a, 42b, 42c, 42d, 42e, 42f, and capacitance coupling between the first wire 72g and the first electrodes 42a, 42b, 42c, 42d, 42e, 42f may be made smaller. Accordingly, noise mixed into the first wire 72g from the piezoelectric elements 4a, 4b, 4c, 4d, 4e, 4f due to electromagnetic interferences of the drive signals may be reduced. Further, the distance between the piezoelectric element 4g and the transmitting portion 14 may be made larger, and noise due to a collision between the transmitting portion 14 and the rotor 110 may be reduced. As described above, the noise mixed into the first wire 72g is reduced, and thereby, detection accuracy of a detection circuit 102 may be improved. The center CP of the vibrating portion 11 is a node of the longitudinal vibration of the vibrating portion 11 at which distortion is larger (though displacement is smaller). Accordingly, the piezoelectric element 4g is placed in the area containing the center CP of the vibrating portion 11, and thereby, intensity of the detection signal may be made larger and the detection accuracy of the detection circuit 102 may be also improved in this regard. Here, "center CP of vibrating portion 11" refers to a center when the vibrating portion 11 is regarded as a vibrator of longitudinal vibration (node of longitudinal vibration) and located between the pair of connecting portions 13 in the vibrating portion 11. Further, in the embodiment, the center CP of the vibrating portion 11 coincides with the geometrical center of the vibrating portion 11.

The first electrode 42e is placed on the transmitting portion 14 side with respect to the first electrode 42g, and the first electrode 42f is placed on the opposite side to the transmitting portion 14 with respect to the first electrode 42g. That is, the first electrodes 42e, 42f are placed in the center part of the piezoelectric material 41 in the width direction along the longitudinal direction of the piezoelectric material 41.

The first electrode 42a is placed on one side of the piezoelectric material 41 in the width direction with respect to the first electrode 42e, and the first electrode 42c is placed on the other side of the piezoelectric material 41 in the width direction with respect to the first electrode 42e. Further, the first electrode 42b is placed on one side of the piezoelectric material 41 in the width direction with respect to the first electrode 42f, and the first electrode 42d is placed on the other side of the piezoelectric material 41 in the width direction with respect to the first electrode 42f. That is, the first electrodes 42a, 42b are placed on one side of the piezoelectric material 41 in the width direction along the longitudinal direction of the piezoelectric material 41 with respect to the first electrodes 42e, 42f, and the first electrodes 42c, 42d are placed on the other side of the piezoelectric material 41 in the width direction along the longitudinal direction of the piezoelectric material 41 with respect to the first electrodes 42e, 42f.

In the first electrodes 42, letting the length of the first electrode 42g as the signal electrode for detection be Lg and letting the length of the piezoelectric material 41 be L, Lg/L is preferably from 0.05 or more to 0.2 or less and more preferably from 0.07 or more to 0.15 or less. Thereby, the intensity of the detection signal may be made larger with the necessary area secured on the piezoelectric material 41 for the first electrodes 42e, 42f as the electrodes for longitudinal vibration. Note that the length Lg of the first electrode 42g refers to the length of the first electrode 42g in upward and downward directions in FIG. 6, i.e., in the directions in which the transmitting portion 14 and the center CP of the vibrating portion 11 are arranged (hereinafter, also referred to as "longitudinal directions"). Similarly, the length L of the piezoelectric material 41 refers to the length of the piezoelectric material 41 in the longitudinal directions.

Letting the width of the first electrode 42g as the signal electrode for detection be W2 and letting the width of the piezoelectric material 41 be W, W2/W is preferably from 0.2 or more to 0.4 or less and more preferably from 0.25 or more to 0.35 or less. Thereby, the intensity of the detection signal may be made larger with the necessary area secured for the wires routed from the first electrodes 42 on the piezoelectric material 41. Note that the width W2 of the first electrode 42g refers to the length of the first electrode 42g in a plan view as seen from the thickness direction of the piezoelectric material 41 in directions (hereinafter, also referred to as "lateral directions") orthogonal to the longitudinal directions (upward and downward directions in FIG. 6). Similarly, the width W of the piezoelectric material 41 refers to the length of the piezoelectric material 41 in the lateral directions. Further, in the drawings, the width W2 of the first electrode 42g is equal to the width W1 (the length in the lateral directions) of the first electrodes 42e, 42f as the electrodes for longitudinal vibration, but may be different. Furthermore, Lg W2 is preferable, but the relationship is not limited to that.

The length Le of the first electrode 42e as the electrode for longitudinal vibration in the longitudinal directions is shorter than the length La of the first electrodes 42a, 42c as the electrodes for flexion in the longitudinal direction. Thereby, unnecessary vibration of the vibrating portion 11 (e.g. the second-order vibration mode of the longitudinal vibration) may be reduced. Similarly, the length Lf of the first electrode 42f as the electrode for longitudinal vibration in the longitudinal directions is shorter than the length Lb of the first electrodes 42b, 42d as the electrodes for flexion in the longitudinal direction. Thereby, also, in this regard, the unnecessary vibration of the vibrating portion 11 (e.g. the second-order vibration mode of the longitudinal vibration) may be reduced. Note that the lengths Le, Lf of the first electrodes 42e, 42f may be equal to or longer than the lengths La, Lb of the first electrodes 42a, 42b, 42c, 42d.

Here, Le/La or Lf/Lb is preferably from 0.5 or more to 0.9 or less and more preferably from 0.7 or more to 0.9 or less. Thereby, the unnecessary vibration of the vibrating portion 11 (e.g. the second-order vibration mode of the longitudinal vibration) may be reduced with the longitudinal vibration of the vibrating portion 11 preferably generated by the first electrodes 42e, 42f. Note that, in the drawing, the length La and the length Lb are equal, but may be different. Further, the length Le and the length Lf are equal, but may be different. When the lengths are different, the length Le is preferably longer than the length Lf in view of efficient generation of the longitudinal vibration of the vibrating portion 11.

Note that the piezoelectric material 41 is integrally formed commonly to the piezoelectric elements 4a, 4b, 4c, 4d, 4e, 4f, however, may be individually divided with respect to each of the piezoelectric elements 4a, 4b, 4c, 4d, 4e, 4f.

The constituent materials of the first electrodes and the second electrode 43 are respectively not particularly limited, but include metal materials e.g. aluminum (Al), nickel (Ni), gold (Au), platinum (Pt), iridium (Ir), copper (Cu), titanium (Ti), and tungsten (W).

Intermediate Member

The intermediate member 5 is provided between the first vibrating plate 2 and the second vibrating plate 3 in the above described supporting portion 12, and has substantially the same shape and size as the supporting portion 12 in the plan view. The intermediate member 5 has a function of reinforcing the supporting portion 12 and regulating the distance between the first vibrating plate 2 and the second vibrating plate 3 in the supporting portion 12 to be equal to the distance between the first vibrating plate 2 and the second vibrating plate 3 in the vibrating portion 11.

As shown in FIG. 4, the intermediate member 5 has a main body 51 and an insulating layer 52 provided on the main body 51. In the intermediate member 5, for example, the main body 51 is formed using silicon and the insulating layer 52 is formed using a silicon oxide film. Note that the constituent material of the intermediate member 5 is not limited to those, but e.g. various ceramics including zirconia, alumina, titania, various resin materials, or the like may be used.

Controller

As shown in FIG. 8, the controller 10 includes a drive circuit 101, the detection circuit 102, and a control unit 104.

The drive circuit 101 is a circuit that generates the drive signals for driving the piezoelectric actuator 1. Specifically, the drive circuit 101 has a first drive circuit 101a, a second drive circuit 101b, and a third drive circuit 101c. The first drive circuit 101a generates the drive signals to be input to the first electrodes 42b, 42c (electrodes for flexion) of the piezoelectric elements 4b, 4c of the piezoelectric actuator 1. The second drive circuit 101b generates the drive signals to be input to the first electrodes 42a, 42d (electrodes for flexion) of the piezoelectric elements 4a, 4d of the piezoelectric actuator 1. The third drive circuit 101c generates the drive signals to be input to the first electrodes 42e, 42f (electrodes for longitudinal vibration) of the piezoelectric elements 4e, 4f of the piezoelectric actuator 1. Each of the first drive circuit 101a, the second drive circuit 101b, and the third drive circuit 101c includes e.g. an oscillation circuit and an amplifier circuit, and generates the drive signal by amplifying the signal from the oscillation circuit in the amplifier circuit. Here, the drive signal is a signal having a voltage value that periodically changes. Note that the waveform of the drive signal is not particularly limited to, but includes e.g. a sinusoidal waveform and rectangular waveform.

The detection circuit 102 is a circuit that detects the vibration of the vibrating portion 11 based on the detection signal from the piezoelectric actuator 1. Specifically, the detection circuit 102 detects the vibration of the vibrating portion 11 based on the detection signal output from the first electrode 42g (signal electrode for detection) of the piezoelectric element 4g of the piezoelectric actuator 1. The detection circuit 102 includes e.g. a phase comparator that outputs a signal according to the phase difference between the detection signal and the drive signal.

The control unit 104 has a function of controlling the respective parts within the controller 10. Particularly, the control unit 104 has a function of controlling driving of the drive circuit 101 based on the detection result of the detection circuit 102. The control unit 104 has e.g. a processor and a memory in which commands readable by the processor are stored, and realizes various functions by the processor reading and executing the commands from the memory.

As described above, the piezoelectric driving device 100 has the vibrating portion 11 including the piezoelectric elements 4a, 4b, 4c, 4d, 4e, 4f (piezoelectric elements for driving) and the piezoelectric element 4g (piezoelectric element for detection) and vibrating by driving of the piezoelectric elements 4a, 4b, 4c, 4d, 4e, 4f, the drive circuit 101 that generates the drive signals for driving the piezoelectric elements 4a, 4b, 4c, 4d, 4e, 4f, and the detection circuit 102 that detects the vibration of the vibrating portion 11 based on the detection signal output from the piezoelectric element 4g with the vibration of the vibrating portion 11, and the piezoelectric element 4g is placed in the area containing the center CP of the vibrating portion 11.

According to the piezoelectric driving device 100, the piezoelectric element 4g is placed in the area containing the center CP of the vibrating portion 11, and thereby, the first wire 72g routed from the piezoelectric element 4g via the connecting portions 13 to outside of the vibrating portion 11 (supporting portion 12) may be prevented from coming closer to the piezoelectric elements 4a, 4b, 4c, 4d, 4e, 4f (more specifically, the first electrodes 42a, 42b, 42c, 42d, 42e, 42f). Accordingly, noise mixed into the first wire 72g from the piezoelectric elements 4a, 4b, 4c, 4d, 4e, 4f due to electromagnetic interferences of the drive signals may be reduced. Further, the distance between the piezoelectric element 4g and the transmitting portion 14 may be made larger, and noise due to a collision between the transmitting portion 14 and the rotor 110 may be reduced. As described above, the noise mixed into the first wire 72g is reduced, and thereby, detection accuracy of a detection circuit 102 may be improved. The center CP of the vibrating portion 11 is the node of the longitudinal vibration of the vibrating portion at which distortion is larger. Accordingly, the piezoelectric element 4g is placed in the area containing the center CP of the vibrating portion 11, and thereby, intensity of the detection signal may be made larger and the detection accuracy of the detection circuit 102 may be also improved in this regard.

On the other hand, if the first electrode 71g is placed in the end part on the transmitting portion 14 side of the vibrating portion 11, the first wire 72g should be passed between the first electrode 71e and the first electrode 71a or 71c and the distance between the first wire 72g and the first electrode 71a, 71c, or 71e becomes smaller. Further, in this case, the first electrode 71g is closer to the transmitting portion 14 and the electric charge generated by the collision between the transmitting portion 14 and the rotor 110 is mixed into the first wire 72g. On the other hand, if the first electrode 71g is placed in the opposite end part to the transmitting portion 14 of the vibrating portion 11, the first wire 72g should be passed between the first electrode 71f and the first electrode 71b or 71d and the distance between the first wire 72g and the first electrode 71b, 71d, or 71f becomes smaller. As described above, when the first electrode 71g is placed in an area apart from the center CP of the vibrating portion 11, noise is easily mixed into the first wire 72g.

Here, the piezoelectric elements 4a, 4b, 4c, 4d, 4e, 4f (piezoelectric elements for driving) have the piezoelectric material 41 with the first surface 41a and the second surface 41b in a front-back relationship, the first electrodes 42a, 42b, 42c, 42d, 42e, 42f (signal electrodes for driving) to which the drive signals are input, and the second electrode 43 (ground electrode for driving) placed on the second surface 41b and connected to the reference potential. The piezoelectric element 4g (piezoelectric element for detection) has the piezoelectric material 41, the first electrode 42g (signal electrode for detection) placed on one (the first surface 41a in the embodiment) of the first surface 41a and the second surface 41b from which the detection signal is output, and the second electrode 43 (ground electrode for detection) placed on the other (the second surface 41b in the embodiment) of the first surface 41a and the second surface 41b and connected to the reference potential.

As described above, the piezoelectric material 41 of the piezoelectric elements 4a, 4b, 4c, 4d, 4e, 4f, 4g are commonalized, and thereby, compared to the case where the piezoelectric material 41 of the piezoelectric elements 4a, 4b, 4c, 4d, 4e, 4f, 4g is individualized, drive efficiency may be increased and the intensity of the detection signal may be increased. Further, it is not necessary to pattern the piezoelectric material 41 with respect to each element, and the manufacturing process may be simplified. Particularly, when the piezoelectric material 41 is formed from a bulk material, simplification of the manufacturing process is remarkable.

Here, the first electrode 42g as the signal electrode for detection is placed on the first surface 41a as the same surface on which the first electrodes 42a, 42b, 42c, 42d, 42e, 42f as the signal electrodes for driving are placed of the first surface 41a and the second surface 41b of the piezoelectric material 41. The second electrode 43 as the ground electrode for detection is placed on the second surface 41b. Thereby, the second electrode 43 may be formed by commonalization of the ground electrode for driving and the ground electrode for detection as the common electrode. Accordingly, formation of the ground electrode for driving and the ground electrode for detection is simpler.

The piezoelectric driving device 100 has the transmitting portion 14 provided on the vibrating portion 11 and transmitting drive power to the rotor 110 (driven member). Further, the first electrodes 42a, 42b, 42c, 42d, 42e, 42f (signal electrodes for driving) have the first electrodes 42a, 42b, 42c, 42d as the electrodes for flexion that generate electric fields for flexural vibration of the vibrating portion 11 between the second electrode 43 (ground electrode for driving) and themselves and the first electrodes 42e, 42f as the electrodes for longitudinal vibration that generate electric fields for stretching vibration without flexion of the vibrating portion 11 between the second electrode 43 (ground electrode for driving) and themselves. Here, the lengths Le, Lf of the first electrodes 42e, 42f (electrodes for longitudinal vibration) in the direction in which the transmitting portion 14 and the center CP of the vibrating portion 11 are arranged are shorter than the lengths La, Lb of the first electrodes 42a, 42b, 42c, 42d (electrodes for flexion). Thereby, the unnecessary vibration of the vibrating portion 11 (e.g. the second-order vibration mode of the longitudinal vibration) may be reduced.

Second Embodiment

Figure 9:
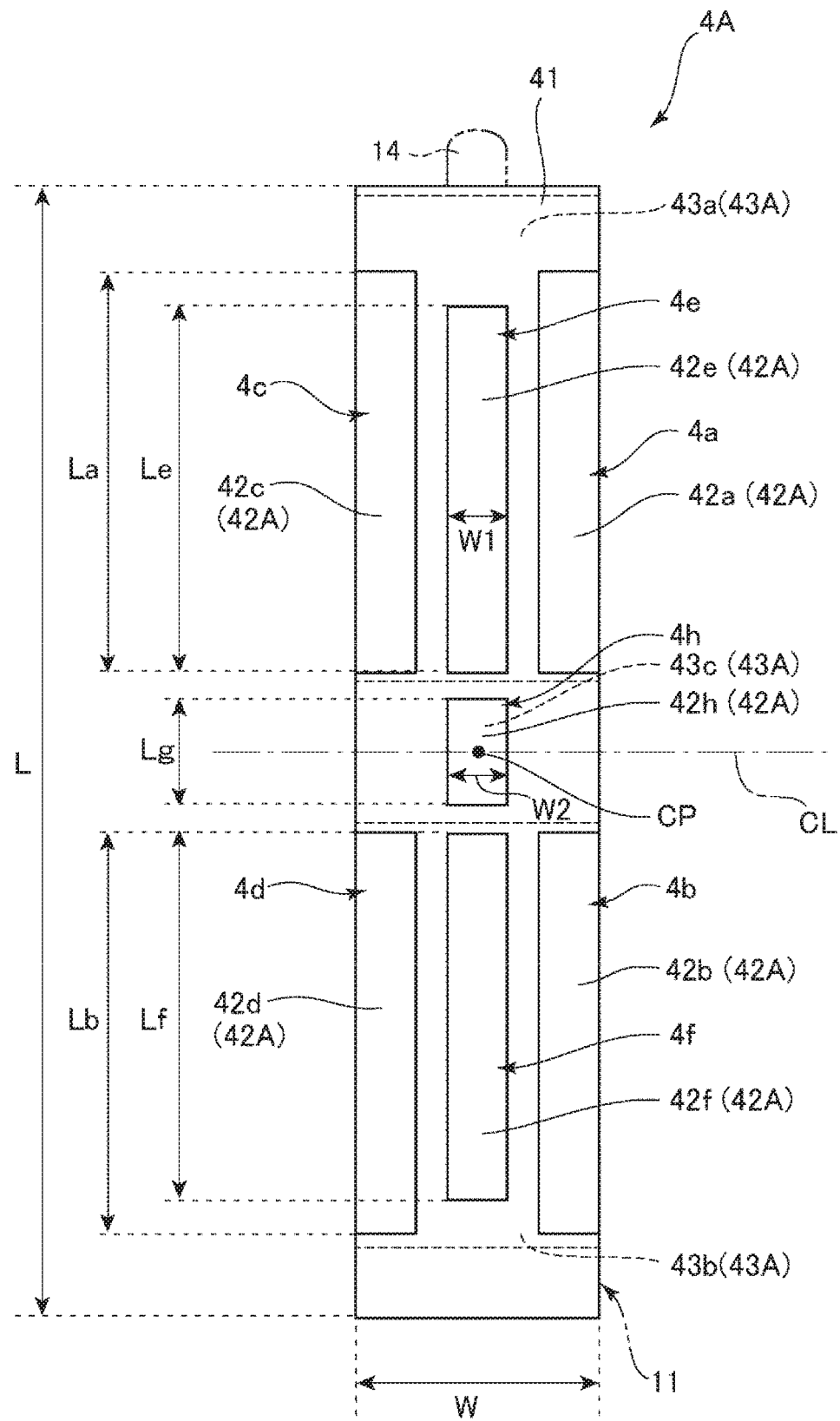
FIG. 9 is a plan view of piezoelectric elements of a piezoelectric actuator of a piezoelectric driving device according to a second embodiment of the invention as seen from a first vibrating plate side.
Figure 10:
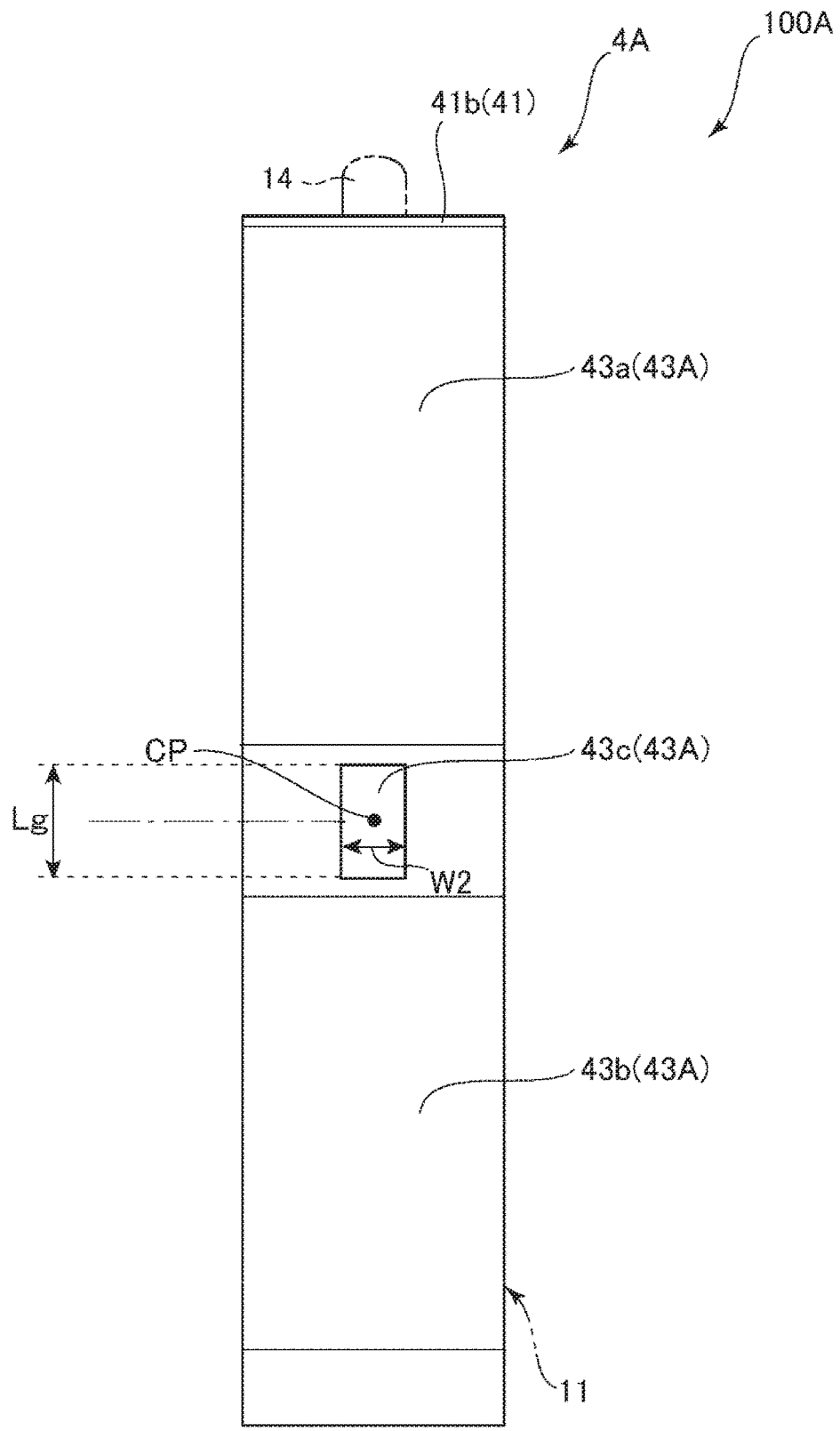
FIG. 10 is a plan view of the piezoelectric elements shown in FIG. 9 as seen from a second vibrating plate side.

FIG. 9 is a plan view of piezoelectric elements of a piezoelectric actuator of a piezoelectric driving device according to the second embodiment of the invention as seen from a first vibrating plate side. FIG. 10 is a plan view of the piezoelectric elements shown in FIG. 9 as seen from a second vibrating plate side. In the following description, the embodiment will be explained with focus on the differences from the above described embodiment and the explanation of the same items will be omitted. Further, in FIGS. 9 and 10, the same configurations as those of the above described embodiment have the same signs.

A piezoelectric driving device 100A of the embodiment has a piezoelectric element 4A in place of the piezoelectric element 4 of the above described first embodiment. As shown in FIG. 9, the piezoelectric element 4A has a piezoelectric element 4h in place of the piezoelectric element 4g of the above described first embodiment. Here, the piezoelectric element 4A has the plate-like piezoelectric material 41, a first electrode 42A placed on one surface of the piezoelectric material 41, and a second electrode 43A placed on the other surface of the piezoelectric material 41.

The first electrode 42A includes a plurality of (seven) first electrodes 42a, 42b, 42c, 42d, 42e, 42f, 42h as individual electrodes individually provided with respect to each of the piezoelectric elements 4a, 4b, 4c, 4d, 4e, 4f, 4h. The first electrode 42h is a ground electrode for detection electrically connected to a fixed potential (e.g. ground potential).

The second electrode 43A has a second electrode 43a commonly provided to the piezoelectric elements 4a, 4c, 4e, a second electrode 43b commonly provided to the piezoelectric elements 4b, 4d, 4f, and a second electrode 43c individually provided on the piezoelectric element 4h. Here, the second electrodes 43a, 43b are respectively ground electrodes for driving electrically connected to a fixed potential (e.g. ground potential). On the other hand, the second electrode 43c is a signal electrode for detection that outputs a detection signal according to the vibration state of the vibrating portion 11.

As described above, in the embodiment, the position relationship between the signal electrode for detection and the ground electrode for detection is opposite to that of the first embodiment. That is, the second electrode 43c (signal electrode for detection) is placed on the second surface 41b of the piezoelectric material 41 and the first electrode 42h (ground electrode for detection) is placed on the first surface 41a of the piezoelectric material 41. Thereby, compared to the case where the signal electrode for detection is placed on the first surface 41a as is the case of the above described first embodiment, the distance between the wire routed from the second electrode 43c (signal electrode for detection) and the first electrodes 42a, 42b, 42c, 42d, 42e, 42f (signal electrodes for driving) may be made larger. Accordingly, noise mixed into the wire from the piezoelectric elements 4a, 4b, 4c, 4d, 4e, 4f due to electromagnetic interferences of the drive signals may be further reduced.

According to the above described piezoelectric driving device 100A of the second embodiment, the same advantages as those of the above described first embodiment may be offered.

2. Robot

Next, an embodiment of a robot according to the invention will be explained.

Figure 11:
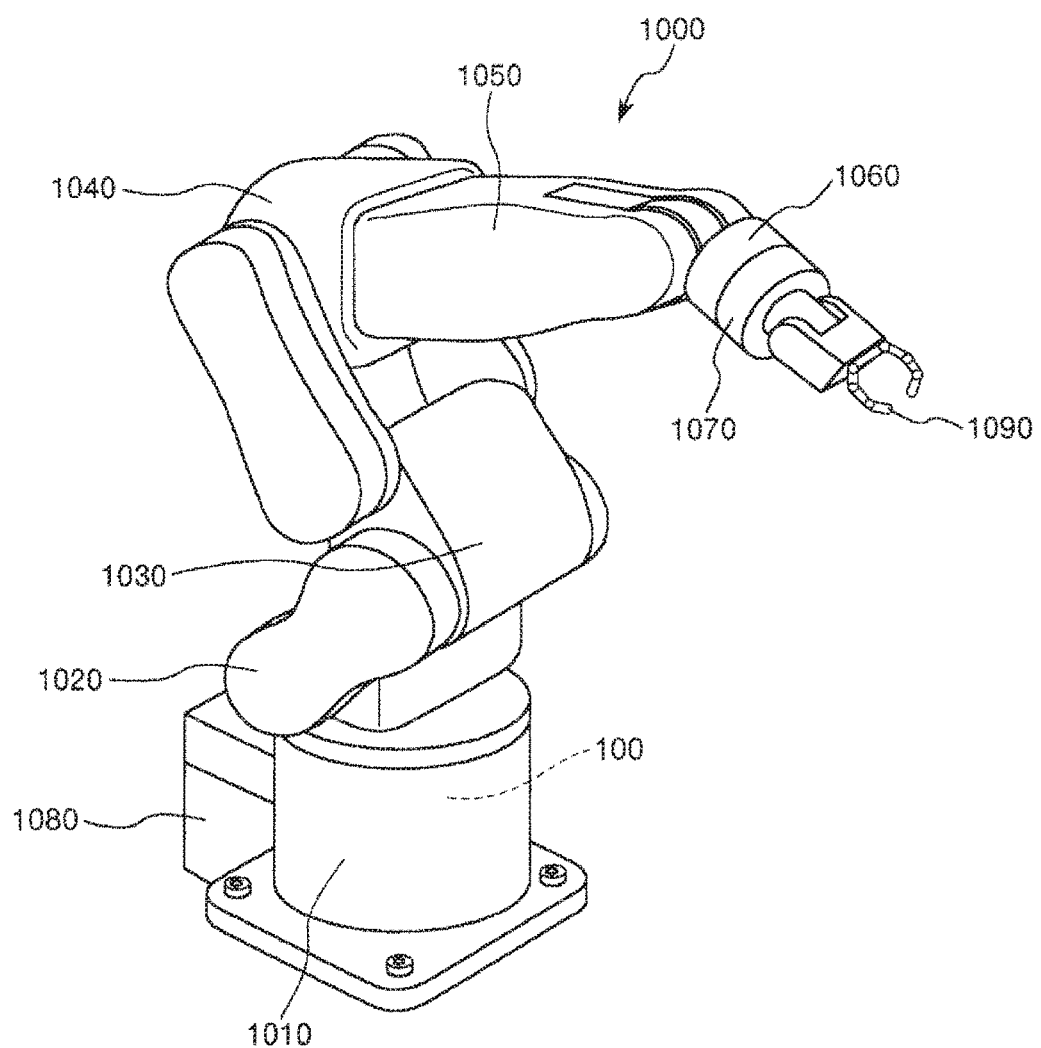
FIG. 11 is a perspective view showing an embodiment of a robot according to the invention.

FIG. 11 is a perspective view showing the embodiment of the robot according to the invention.

A robot 1000 shown in FIG. 11 may perform work of feeding, removing, carrying, assembly, etc. of precision apparatuses and components forming the apparatuses (objects). The robot 1000 is a six-axis robot, and has a base 1010 fixed to a floor or ceiling, an arm 1020 rotatably coupled to the base 1010, an arm 1030 rotatably coupled to the arm 1020, an arm 1040 rotatably coupled to the arm 1030, an arm 1050 rotatably coupled to the arm 1040, an arm 1060 rotatably coupled to the arm 1050, an arm 1070 rotatably coupled to the arm 1060, and a control unit 1080 that controls driving of these arms 1020, 1030, 1040, 1050, 1060, 1070. In the arm 1070, a hand connecting part is provided, and an end effector 1090 according to work to be executed by the robot 1000 is attached to the hand connecting part. The piezoelectric driving devices 100 are mounted on all or part of respective joint parts and the respective arms 1020, 1030, 1040, 1050, 1060, 1070 are rotated by driving of the piezoelectric driving devices 100. Note that the driving of the respective piezoelectric driving devices 100 is controlled by the control unit 1080. Further, the piezoelectric driving device 100A may be used in place of the piezoelectric driving device 100.

As described above, the robot 1000 has the piezoelectric driving devices 100. According to the robot 1000, the piezoelectric driving devices 100 may detect the vibration states of the vibrating portions 11 with high accuracy and perform high-accuracy drive control. Accordingly, high-accuracy drive control of the robot 1000 may be performed.

3. Electronic Component Conveyance Apparatus

Next, an embodiment of an electronic component conveyance apparatus according to the invention will be explained.

Figure 12:
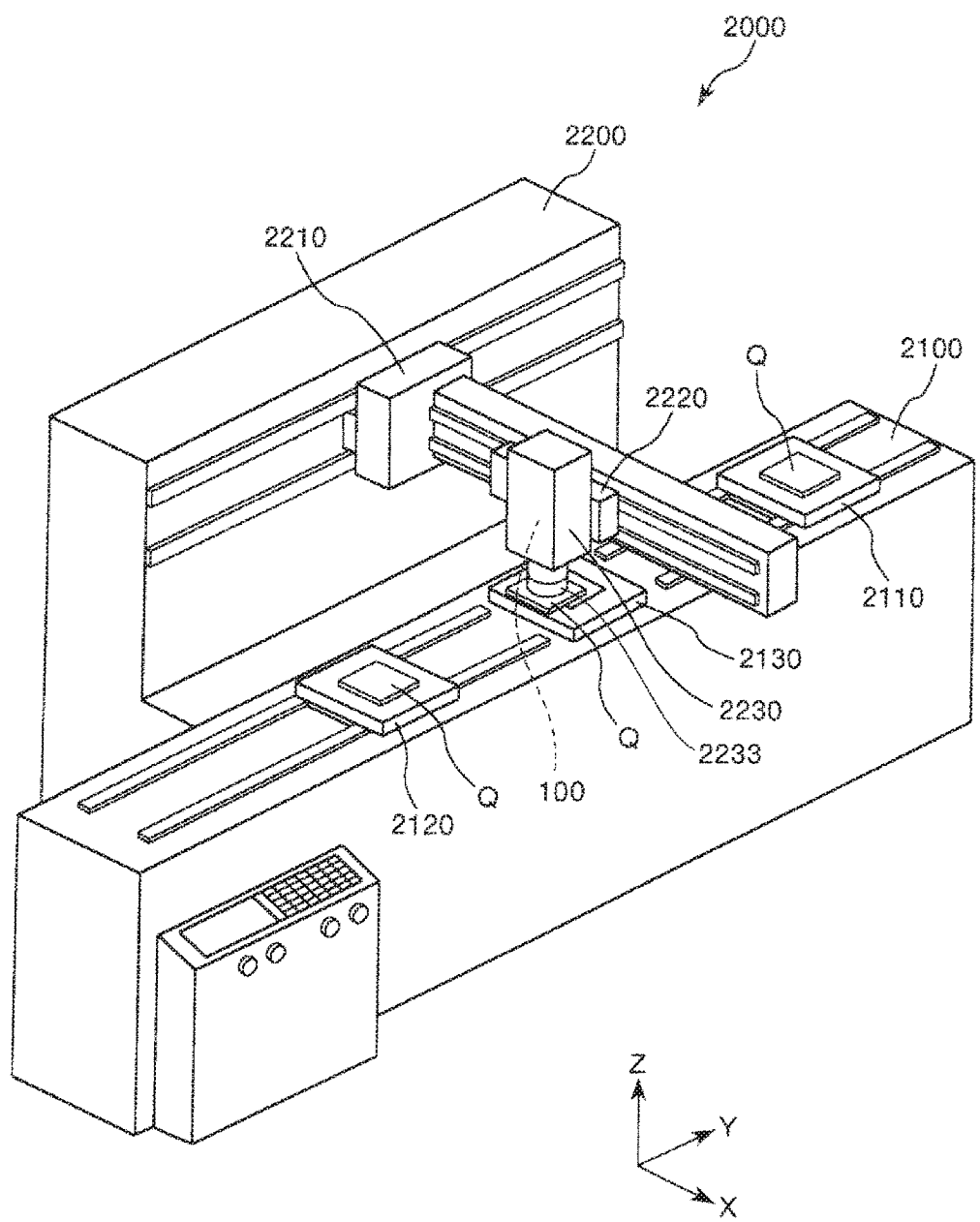
FIG. 12 is a perspective view showing an embodiment of an electronic component conveyance apparatus according to the invention.

FIG. 12 is a perspective view showing the embodiment of the electronic component conveyance apparatus according to the invention. Hereinafter, for convenience of explanation, three axes orthogonal to one another are referred to as "X-axis", "Y-axis", and "Z-axis".

An electronic component conveyance apparatus 2000 shown in FIG. 12 is applied to an electronic component inspection apparatus, and has a base 2100 and a support 2200 provided on a side of the base 2100. Further, on the base 2100, an upstream stage 2110 on which an electronic component Q to be inspected is mounted and conveyed in the Y-axis directions, a downstream stage 2120 on which an electronic component Q that has been inspected is mounted and conveyed in the Y-axis directions, and an inspection table 2130 located between the upstream stage 2110 and the downstream stage 2120 for inspection of electrical characteristics of the electronic components Q are provided. Note that examples of the electronic components Q include e.g. semiconductors, semiconductor wafers, display devices such as CLD and OLED, quartz crystal devices, various sensors, inkjet heads, various MEMS devices, etc.

Further, a Y-stage 2210 movable in the Y-axis directions with respect to the support 2200 is provided on the support 2200, an X-stage 2220 movable in the X-axis directions with respect to the Y-stage 2210 is provided on the Y-stage 2210, and an electronic component holding unit 2230 movable in the Z-axis directions with respect to the X-stage 2220 is provided on the X-stage 2220.

The electronic component holding unit 2230 has a holding part 2233 provided to be movable in the X-axis directions and the Y-axis directions and rotatable about the Z-axis and holding the electronic component Q. Further, the piezoelectric driving device 100 is provided in the electronic component holding unit 2230, and the holding part 2233 moves in the X-axis directions and the Y-axis directions and rotates about the Z-axis by drive power of the piezoelectric driving device 100. Note that the piezoelectric driving device 100A may be used in place of the piezoelectric driving device 100.

As described above, the electronic component conveyance apparatus 2000 has the piezoelectric driving device 100. According to the electronic component conveyance apparatus 2000, the piezoelectric driving device 100 may detect the vibration state of the vibrating portion with high accuracy and perform high-accuracy drive control. Accordingly, high-accuracy drive control of the electronic component conveyance apparatus 2000 may be performed.

4. Printer

Figure 13:
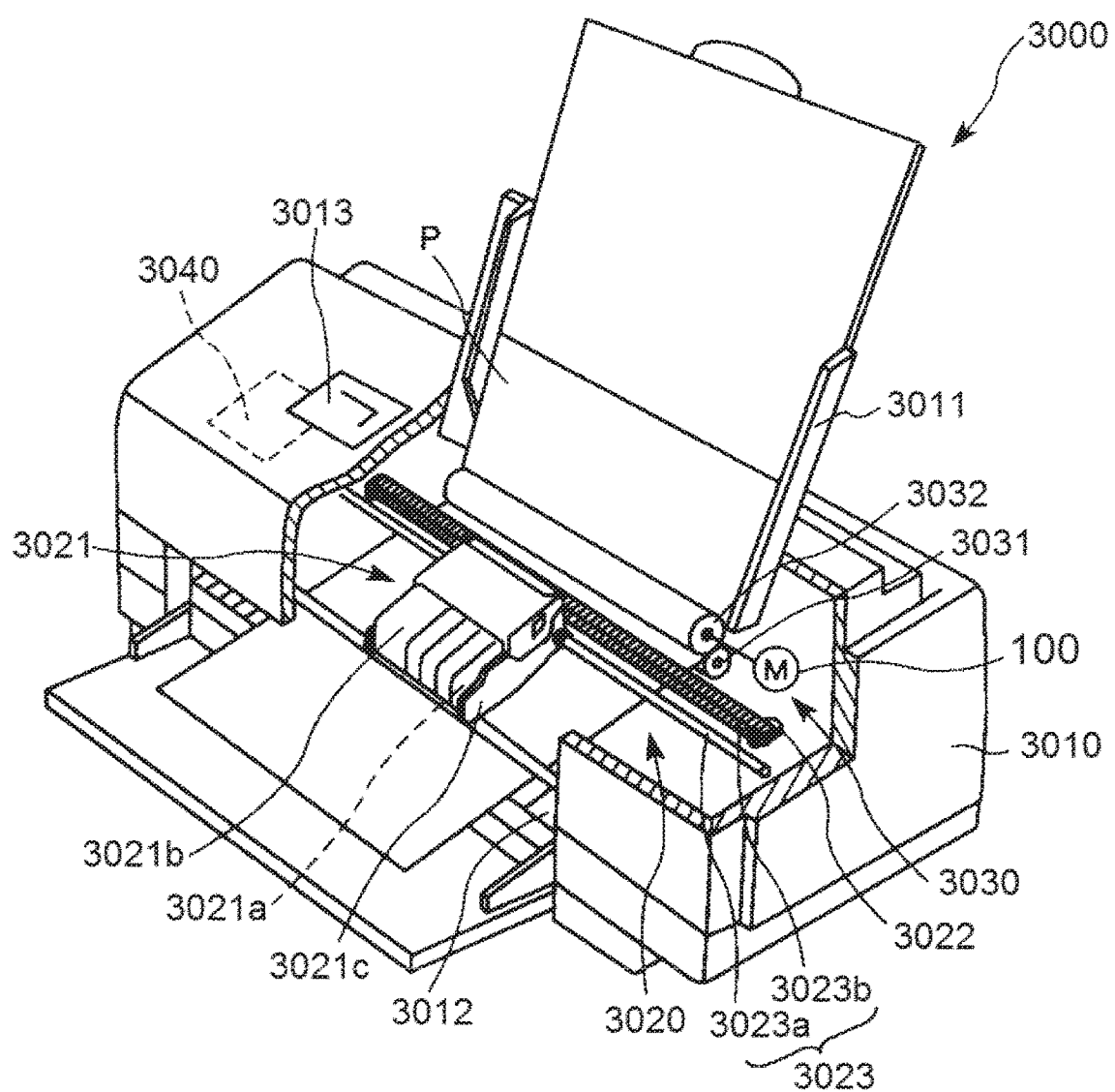
FIG. 13 is a perspective view showing an embodiment of a printer according to the invention.

FIG. 13 is a perspective view showing an embodiment of a printer according to the invention.

A printer 3000 shown in FIG. 13 is an inkjet recording printer. The printer 3000 includes an apparatus main body 3010, a printing mechanism 3020 provided inside of the apparatus main body 3010, a paper feed mechanism 3030, and a control unit 3040.

In the apparatus main body 3010, a tray 3011 in which recording paper P is placed, a paper eject opening 3012 through which the recording paper P is ejected, and an operation panel 3013 of a liquid crystal display or the like are provided.

The printing mechanism 3020 includes a head unit 3021, a carriage motor 3022, and a reciprocation mechanism 3023 that reciprocates the head unit 3021 by drive power of the carriage motor 3022. The head unit 3021 has a head 3021*a* as an inkjet recording head, an ink cartridge 3021*b* that supplies ink to the head 3021*a*, and a carriage 3021*c* on which the head 3021*a* and the ink cartridge 3021*b* are mounted. The reciprocation mechanism 3023 has a carriage guide shaft 3023*b* that reciprocably supports the carriage 3021*c* and a timing belt 3023*a* that moves the carriage 3021*c* on the carriage guide shaft 3023*b* by the drive power of the carriage motor 3022.

The paper feed mechanism 3030 has a driven roller 3031 and a driving roller 3032 in press contact with each other, and the piezoelectric driving device 100 as a paper feed motor that drives the driving roller 3032. Note that the piezoelectric driving device 100A may be used in place of the piezoelectric driving device 100.

The control unit 3040 controls the printing mechanism 3020, the paper feed mechanism 3030, etc. based on print data input from a host computer such as a personal computer, for example.

In the printer 3000, the paper feed mechanism 3030 intermittently feeds the recording paper P one by one to the vicinity of the lower part of the head unit 3021. Concurrently, the head unit 3021 reciprocates in directions nearly orthogonal to the feed direction of the recording paper P, and printing on the recording paper P is performed.

As described above, the printer 3000 has the piezoelectric driving device 100. According to the printer 3000, the piezoelectric driving device 100 may detect the vibration state of the vibrating portion 11 with high accuracy and perform high-accuracy drive control. Accordingly, high-accuracy drive control of the printer 3000 may be performed.

5. Projector

Figure 14:
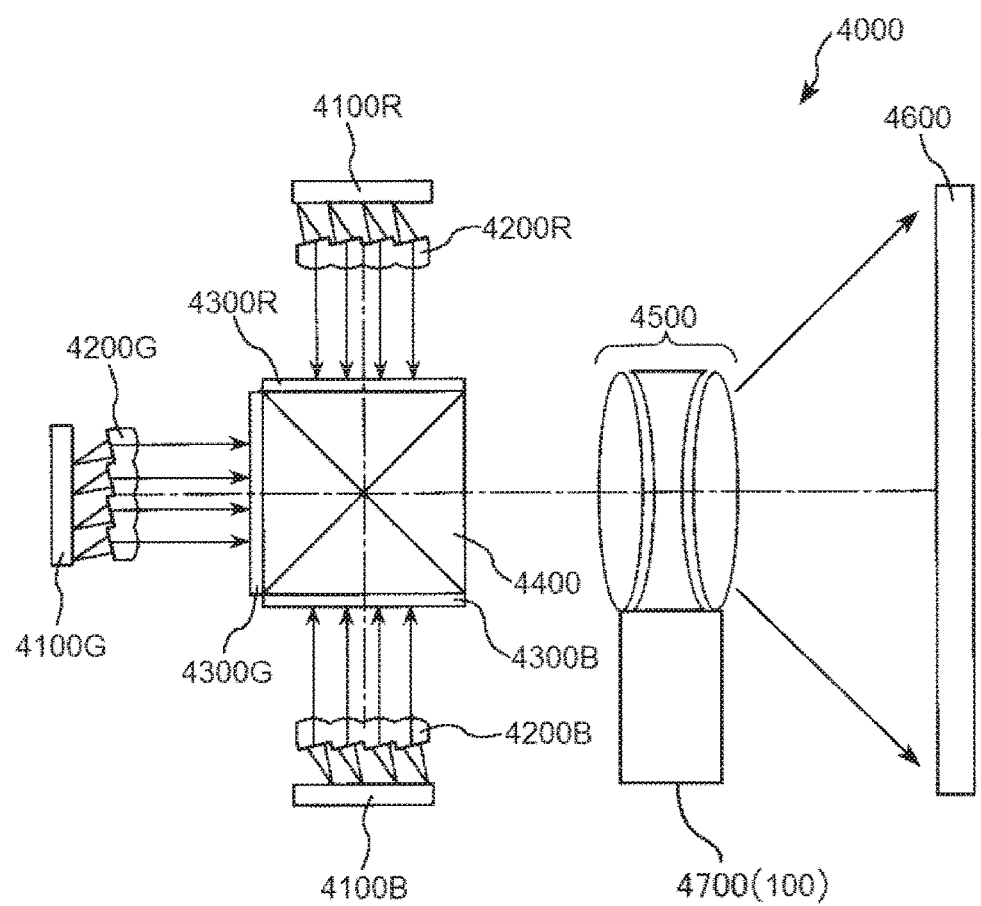
FIG. 14 is a schematic diagram showing an embodiment of a projector according to the invention.

FIG. 14 is a schematic diagram showing an embodiment of a projector according to the invention.

A projector 4000 shown in FIG. 14 has a light source 4100R that emits red light, a light source 4100G that emits green light, a light source 4100B that emits blue light, lens arrays 4200R, 4200G, 4200B, transmissive liquid crystal light valves (light modulation units) 4300R, 4300G, 4300B, a cross dichroic prism 4400, a projection lens (projection unit) 4500, and a piezoelectric driving device 4700.

The lights emitted from the light sources 4100R, 4100G, 4100B enter the liquid crystal light valves 4300R, 4300G, 4300B via the lens arrays 4200R, 4200G, 4200B, respectively. The respective liquid crystal light valves 4300R, 4300G, 4300B modulate the entering lights according to image information.

The three color lights modulated by the respective liquid crystal light valves 4300R, 4300G, 4300B enter the cross dichroic prism 4400 and are combined. The light combined by the cross dichroic prism 4400 enters the projection lens 4500 as a projection system. The projection lens 4500 enlarges and projects the image formed by the liquid crystal light valves 4300R, 4300G, 4300B on a screen (display surface) 4600. Thereby, a desired picture is projected on the screen 4600. Here, the projection lens 4500 is supported by the piezoelectric driving device 4700 as the piezoelectric driving device 100 or 100A so that changes in position and attitude (positioning) can be made by driving of the piezoelectric driving device 4700. Thereby, the shape, size, etc. of the picture projected on the screen 4600 may be adjusted.

Note that, in the above described example, the transmissive liquid crystal light valves are used as the light modulation units, however, other light valves than those of liquid crystal may be used or reflective light valves may be used. The light valves include e.g. reflective liquid crystal light valves and digital micromirror devices. The configuration of the projection system is appropriately changed depending on the type of the light valves for use. The projector may be a scan-type projector that displays an image in a desired size on the display surface by scanning the screen with light.

As described above, the projector 4000 has the piezoelectric driving device 100. According to the projector 4000, the piezoelectric driving device 100 may detect the vibration state of the vibrating portion 11 with high accuracy and perform high-accuracy drive control. Accordingly, high-accuracy drive control of the projector 4000 may be performed.

As above, the piezoelectric driving device, the robot, the electronic component conveyance apparatus, the printer, and the projector according to the invention are explained based on the illustrated embodiments, however, the invention is not limited to those. The configurations of the respective parts may be replaced by arbitrary configurations having the same functions. Further, other arbitrary configurations may be added to the invention. Furthermore, the respective embodiments may be combined as appropriate.

In the above described embodiments, the configurations in which the piezoelectric driving device (piezoelectric motor) is applied to the robot, the electronic component conveyance apparatus, the printer, and the projector are explained, however, the piezoelectric driving device may be applied to other various electronic devices.

The entire disclosure of Japanese Patent Application No. 2018-044543, filed Mar. 12, 2018 is expressly incorporated by reference herein.

What is claimed is:

1. A piezoelectric driving device comprising:
a vibrating portion including a piezoelectric element for driving and a piezoelectric element for detection and vibrating by driving of the piezoelectric element for driving;
a drive circuit that generates a drive signal for driving the piezoelectric element for driving;
a detection circuit that detects vibration of the vibrating portion based on a detection signal output from the piezoelectric element for detection with the vibration of the vibrating portion; and
a transmitting portion provided above the vibrating portion and transmitting drive power to a driven member, wherein the piezoelectric element for detection is placed in an area containing a center of the vibrating portion,
the piezoelectric element for driving includes a signal electrode for driving to which the drive signal is input,
the piezoelectric element for detection includes a signal electrode for detection to which the drive signal is output,
the signal electrode for driving includes an electrode for flexion that generates an electric field for flexural vibration of the vibrating portion and an electrode for longitudinal vibration that generates an electric field for stretching vibration of the vibrating portion without flexion,
the electrode for flexion is separated in a region including the center of the vibrating portion,
the electrode for longitudinal vibration is separated in a region including the center of the vibrating portion,
a separated distance of bending the electrode for flexion in a direction in which the transmitting portion and the center of the vibrating portion are arranged is longer than a length of the signal electrode.

2. The piezoelectric driving device according to claim 1, wherein a length of the electrode for longitudinal vibration in a direction in which the transmitting portion and the center of the vibrating portion are arranged is shorter than a length of the electrode for flexion.

3. A robot comprising the piezoelectric driving device according to claim 1.

4. An electronic component conveyance apparatus comprising the piezoelectric driving device according to claim 1.

5. A printer comprising the piezoelectric driving device according to claim 1.

6. A projector comprising the piezoelectric driving device according to claim 1.

* * * * *